United States Patent
Bothra

(10) Patent No.: US 6,189,136 B1
(45) Date of Patent: Feb. 13, 2001

(54) DESIGN LEVEL OPTICAL PROXIMITY CORRECTION METHODS

(75) Inventor: Subhas Bothra, San Jose, CA (US)

(73) Assignee: Philips Electronics, North America Corp., New York, NY (US)

( * ) Notice: Under 35 U.S.C. 154(b), the term of this patent shall be extended for 0 days.

(21) Appl. No.: 09/119,711

(22) Filed: Jul. 20, 1998

(51) Int. Cl.[7] ............................. G06F 17/50; G06F 19/00
(52) U.S. Cl. ............................. 716/21; 700/120; 700/121; 378/35; 430/5; 250/492.22
(58) Field of Search ........................... 395/500.2, 500.21, 395/500.22; 716/19–21; 378/34–35; 700/120–121; 364/468.27–468.28; 430/5; 250/492.2–492.22

(56) References Cited

U.S. PATENT DOCUMENTS

| | | | |
|---|---|---|---|
| 4,520,269 | * 5/1985 | Jones | 250/492.2 |
| 4,812,962 | 3/1989 | Witt | 716/21 |
| 5,475,766 | 12/1995 | Tsuchiya et al. | 382/144 |
| 5,553,273 | * 9/1996 | Liebmann | 716/21 |
| 5,705,301 | * 1/1998 | Garza et al. | 430/5 |
| 5,723,233 | 3/1998 | Garza et al. | 430/5 |
| 5,740,068 | * 4/1998 | Liebmann et al. | 716/21 |
| 5,827,623 | * 10/1998 | Ishida et al. | 430/5 |
| 5,862,058 | * 1/1999 | Samuels et al. | 716/21 |
| 5,900,338 | * 5/1999 | Garza et al. | 430/5 |
| 5,920,487 | * 7/1999 | Reich et al. | 716/21 |
| 5,972,541 | * 10/1999 | Sugaswara et al. | 430/5 |
| 5,994,009 | * 11/1999 | Tzu et al. | 430/30 |

OTHER PUBLICATIONS

Cook et al. ("PYRAMID–a hierarchical, ruled–based approach toward proximity effect correction, Part II: Correction", IEEE Transactions on Semiconductor Manufacturing, vol. 11, No. 1, Jan. 1998, Conference held on Oct. 2, 1996, pp. 117–128).*

Harafuji et al. ("A novel hierarchical approach for proximity effect correction in electron beam lithography", IEEE Transactions on Computer–Aided Design of Integrated Circuits and Systems, vol. 12, No. 10, Oct. 1993, pp. 1508–1514).*

* cited by examiner

Primary Examiner—Kevin J. Teska
Assistant Examiner—Phallaka Kik
(74) Attorney, Agent, or Firm—Martine Penilla & Kim, LLP

(57) ABSTRACT

A method for integrating correction features onto selected design features of an integrated circuit mask. The method includes identifying a minimum dimension in the integrated circuit mask. The minimum dimension is configured to define transistor gate electrode features or any critical feature geometry. The method then includes removing feature geometries that are dimensionally larger than the minimum dimension. After the removing operation, correction features are integrated with selected ends of the transistor electrode features that have the minimum dimension to produce corrected transistor gate electrode features. Then, the method includes the operation of adding the corrected transistor gate electrode features to the removed feature geometries that are dimensionally larger than the minimum dimension to produce a corrected integrated circuit mask.

20 Claims, 15 Drawing Sheets

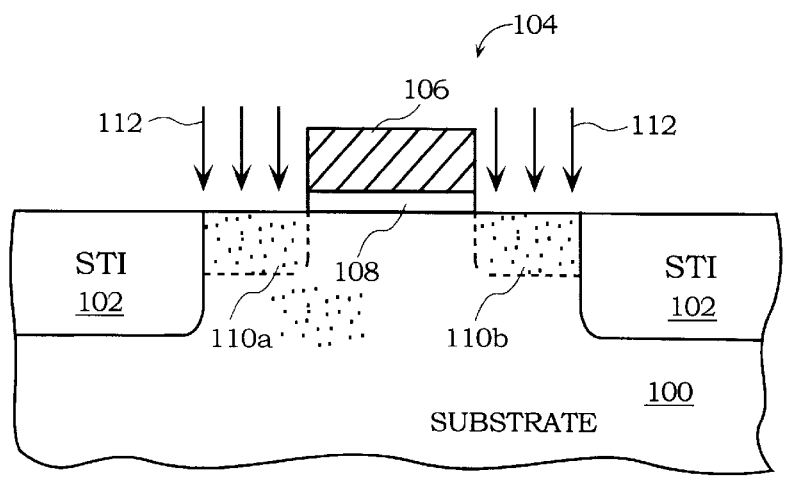
FIG. 1A
(Prior Art)
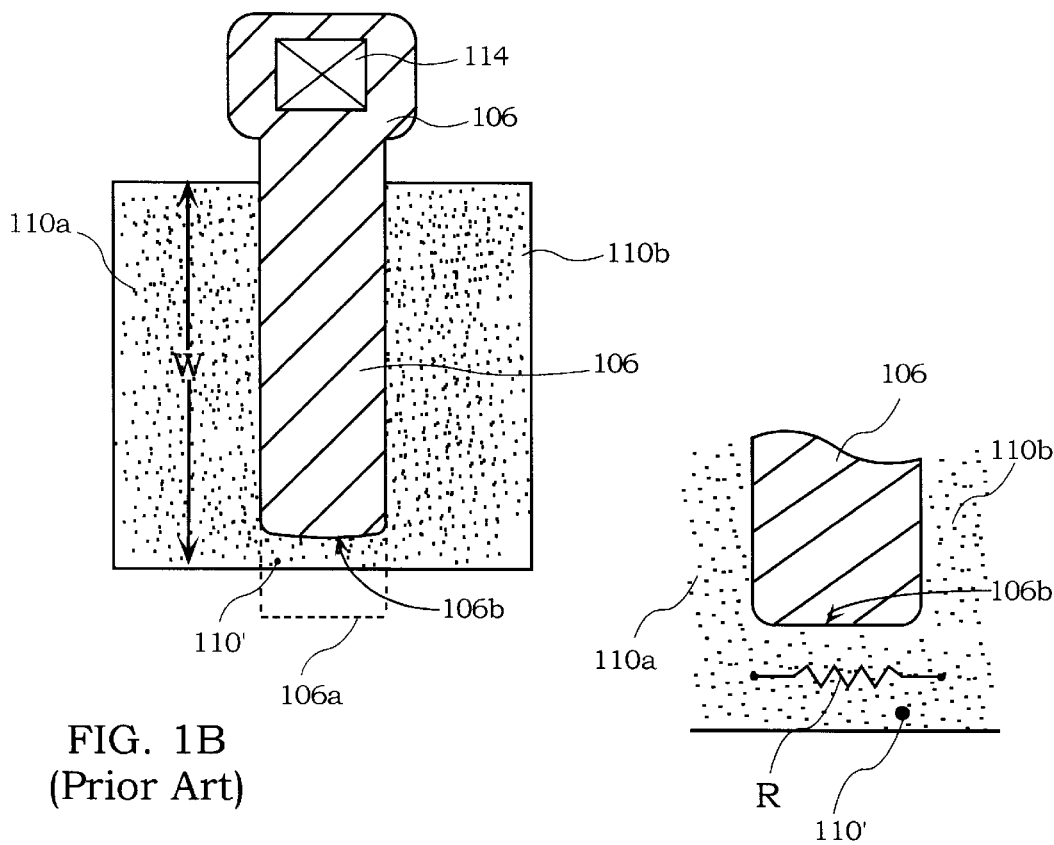
FIG. 1B
(Prior Art)
FIG. 1C
(Prior Art)

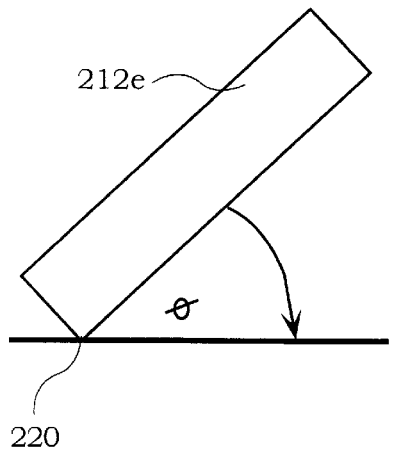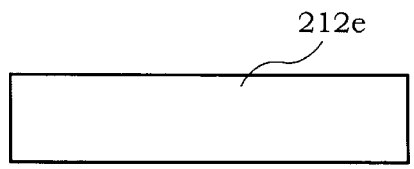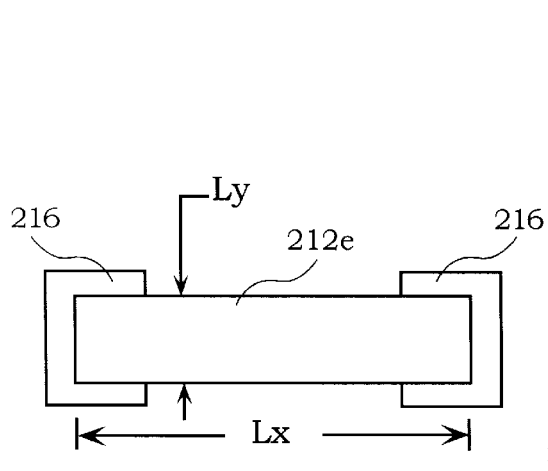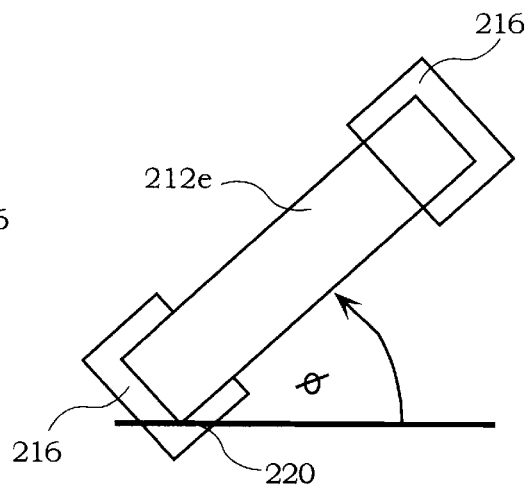
FIG. 4B  FIG. 4C
FIG. 4D  FIG. 4E

DESIGN LEVEL OPTICAL PROXIMITY CORRECTION METHODS

BACKGROUND OF THE INVENTION

1. Field of the Invention

The present invention relates generally to integrated circuits and, more particularly, to computer automated methods for implementing corrections to geometric feature masks used in photolithography to compensate for optical proximity effects.

2. Description of the Related Art

As the demand for faster, smaller, and more densely packed integrated circuit designs continue to increase, a greater burden is placed on design engineers to improve mask designs. A common technique used to improve mask designs is to modify mask feature geometries in order to compensate for anticipated photolithography optical proximity effects that become more pronounced when device features decrease in size. Generally, the greatest demand for increased density lies in the core region of an integrated circuit design, which requires thousands of closely packed polysilicon gate features. However, the increased density of the polysilicon gate features in the core region is also known to promote optical proximity effects that cause gate shrinkage and other deforming effects. That is, although the polysilicon gate is designed with a sufficient amount of overlap over the diffusion region, the gate shrinkage may produce devices in which the gate does not adequately overlap the diffusion regions.

With this in mind, FIG. 1A shows a cross-sectional view of a substrate 100 having a transistor device 104 fabricated thereon. In this example, the transistor device 104 is formed between shallow trench isolation (STI) regions 102 which are used to isolate neighboring transistors throughout an integrated circuit design. During the fabrication of the transistor device 104, a gate oxide 108 and a polysilicon gate 106 is formed before an impurity implant 112 is performed. As is well known in the art, the impurity implants 112 are performed to form diffusion regions 110a and 110b which will function as either a source or a drain depending upon the wiring of the transistor device 104.

During the design of the polysilicon gate 106, a mask design is created such that the polysilicon gate 106 will extend over the entire width (W) of the transistor device 104 as shown in FIG. 1B. Unfortunately, due to optical proximity effects, the ideal mask design that is used to define the polysilicon gate 106 will experience optical proximity shrinking, rounding, and even alignment tolerances as shown by edge 106b. More specifically, when the polysilicon gate 106 mask was designed, the mask was designed to extend past the width (W) of the diffusion regions 110a and 110b as shown by the ideal mask edge 106a. Although optical proximity shrinking is a commonplace problem in the design of sub-micron technology devices, the optical proximity problems tend to impact transistor device functionality most when shrinkage occurs to the polysilicon gate 106 of core region transistors.

FIG. 1C shows a magnification of the shrinkage and rounding that occurred at the edge 106b of the polysilicon gate 106. Because the transistor gate 106 is no longer extending over the entire diffusion regions 110a and 101b, the subsequent impurity implant 112 will also cause the diffusion region to be formed in region 110'. As a result, the functional characteristics of the transistor device 104 will be severely hampered due to leakage currents that can occur between the diffusion regions 110a and 110b. As pictorially illustrated, the diffusion regions 110a and 110b will only be separated by a resistance "R," which allows the leakage currents to flow between the drain and source even when the transistor device 104 is intended to be in an OFF state. Consequently, an integrated circuit design having transistor devices which conduct current when they are not intended to conduct will disrupt the functionality of the entire integrated circuit.

To combat this known optical proximity effect, a number of optical proximity correction (OPC) software tools have been introduced and are readily used. A couple of exemplary companies that produce OPC software include: (1) Trans Vector Technologies, Inc., of Camarillo, Calif; and (2) OPC Technology, Inc., of San Jose, Calif. Typically, optical proximity correction tools are designed to scan over an entire mask having feature geometries in digital form, and implement a correction at locations which are known to suffer from optical proximity effects. As shown in FIG. 1D, OPC software is typically used to add (or subtract) correction features such as 116a, 116b, and 116c to desired locations on features selected by the OPC software. Unfortunately, performing OPC on selected features of a given design mask in an integrated circuit design requires that the completed mask be completely analyzed by the OPC software, which suggests locations for correction features 116. Depending on the size of the mask, this process can be quite computationally intensive.

Many times, the suggested locations for the correction features are not in the locations in which designers know or anticipate shrinking and rounding to will occur. When that happens, design engineers are required to manually inspect the locations of the suggested correction features and then make adjustments as necessary. Although simplistic in theory, such manual corrections are very laborious because many of today's integrated circuit designs have thousands and some times millions of transistor devices, especially in the core region. Taking for example, the aforementioned shrinkage problem of the polysilicon gate 106, a mask designer would have to manually inspect each edge of a polysilicon gate feature to ensure that the appropriate correction feature has been added to the end of the polysilicon gate 106. This, of course, can take a very long time.

In some instances, as shown in FIG. 1D, a polysilicon gate 106' may not include the proper correction features, which will therefore have to be added by the design engineer whose task it is to inspecting the mask. In sum, although the use of today's optical proximity correction (OPC) software packages have improved the identification of possible optical proximity problem areas, today's OPC software still poses a high degree of burden on a design engineer to manually inspect certain types of critical features throughout an integrated circuit design. Consequently, because shrinkage is so common with the polysilicon gate 106, and the polysilicon gate 106 is an important and critical feature of an integrated circuit design, such features have to be manually inspected and adjusted if necessary, each time a new mask design for the polysilicon gate 106 is designed.

In view of the foregoing, there is a need for methods for automatically correcting critical design features during the initial design phase, which will reduce the need for specialized optical proximity correction techniques and then subsequent manual inspection and laborious correction.

SUMMARY OF THE INVENTION

Broadly speaking, the present invention fills these needs by providing automated methods for correcting critical design features during the design phase in order to reduce the need for specialized OPC software. It should be appreciated that the present invention can be implemented in numerous ways, including as a process, an apparatus, a system, a device, a computer readable medium or a method. Several inventive embodiments of the present invention are described below.

In one embodiment, disclosed is a method for correcting features of an integrated circuit design that is embodied on a mask and is in the form of a digital file. The method includes providing a transistor gate feature mask having transistor gates that have minimum gate lengths (i.e., which define the transistor channel) and contact heads. At this point, the transistor gates are sized down by about half of the minimum gate lengths, such that only reduced size contact heads remain. Then, sizing up the reduced size contact heads to produce individual contact heads, and inverting the individual contact heads. The method further includes performing a logical AND operation between the transistor gate feature mask and the inverted individual contact heads to produce modified transistor gates without the contact heads. The method then includes adding correction features to selected ends of the modified transistor gates without contact heads to produce corrected transistor gates. And then performing a logical OR operation between the corrected transistor gates and the transistor gate feature mask to produce a corrected transistor gate feature mask.

In another embodiment, a method for integrating correction features onto selected design features of an integrated circuit mask is disclosed. The method includes identifying a minimum dimension in the integrated circuit mask. The minimum dimension is configured to define transistor gate electrode features. The method then includes removing feature geometries that are dimensionally larger than the minimum dimension. After the removing operation, correction features are integrated with selected ends of the transistor electrode features that have the minimum dimension to produce corrected transistor gate electrode features. And, adding the corrected transistor gate electrode features to the removed feature geometries that are dimensionally larger than the minimum dimension to produce a corrected integrated circuit mask.

In yet another embodiment, a method for correcting core circuitry transistor geometries for anticipated optical proximity distortion is disclosed. The method includes: (a) selecting features in a polysilicon mask that have a minimum dimension, such that the minimum dimension defines transistor gate electrodes; (b) adding correction geometries to selected ends of the transistor gate electrodes to produce corrected transistor gate electrodes; and (c) combining features in the polysilicon mask that do not have the minimum dimension and the corrected transistor gate electrodes to produce a corrected polysilicon mask.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 1A shows a cross-sectional view of a substrate having a transistor device fabricated thereon.

FIG. 1B shows a top view of the transistor device of FIG. 1A having a distorted polysilicon gate structure.

FIG. 1C shows a magnification of the shrinkage and rounding that occurred at an edge of the polysilicon gate.

FIGS. 4A–4G pictorially illustrate further operations that are performed by the mask generation software to integrate correction features to the identified features, in accordance with one embodiment of the present invention.

DETAILED DESCRIPTION OF THE PREFERRED EMBODIMENTS

An invention is disclosed for computer automated methods for correcting critical design features during the mask design phase in order to reduce the need for specialized OPC software. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

As the size of semiconductor device features continue to shrink and the demand for increased circuit density has correspondingly increased, semiconductor device designers have been turning to automated design tools to quickly analyze, modify, and compare multiple design layer masks. As is well known, each design layer is typically stored as a digital data file that identifies the X and Y coordinates of the various features that make up each design layer. In the various embodiments of the present invention, a mask generator software layout tool that empowers designers to perform numerous logical operations, such as, AND operations, OR operations, XOR operations, etc., between the digital data of two design layer masks is used. The mask generation software tool also enables operations that increase the size (i.e., bloat operator) of selected features on a given design layer mask. One exemplary mask generation tool is a product named CATS (computer aided transcription system), which is made by Transcription Enterprises, L.T.D., of Los Gatos, Calif. The details of this product are incorporated by reference herein. Once a design layer is complete, it may be transferred to a reticle (i.e., to make a reticle mask) that is used in photolithography fabrication operations. These photolithography operations in turn are used at many stages in the fabrication of an IC chip.

Figure 2A:
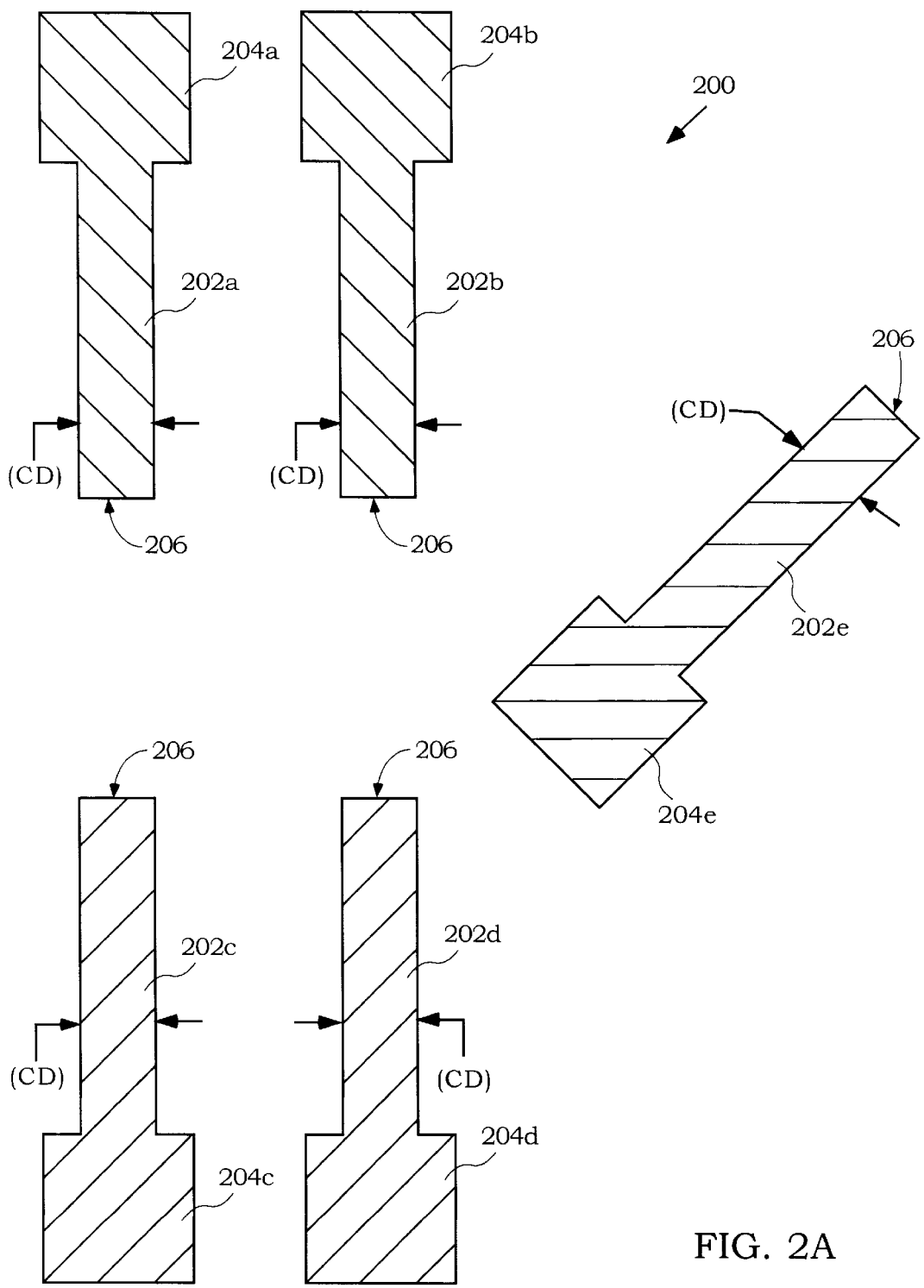
FIG. 2A shows a top level view of a transistor gate mask in accordance with one embodiment of the present invention.

FIG. 2A shows a top level view of a transistor gate mask 200 in accordance with one embodiment of the present invention. The transistor gate mask 200 represents the layout of exemplary transistor gate features 202a through 202e, and the associated transistor gate contact features 204a through 204e. Although the transistor gate features 202 and the transistor gate contact features 204 are illustrated as two separate geometric features, they are actually one integral feature that is defined in the digital file that defines the transistor gate mask 200.

As mentioned previously, the transistor gate features 202 suffer in that their feature edges 206 tend to shrink when they are eventually transferred as a physical layer on a semiconductor substrate. To avoid the shrinkage problem, correction features are automatically designed into the mask during the mask design stage at selected feature edges (e.g., such as edges 206) of the transistor gate features 202. As shown, the transistor gate features 202 have a critical dimension (CD), which defines the gate lengths of the transistor devices that will ultimately be formed by the transistor gate features 202. The critical dimension (CD) is also commonly referred to as a minimum gate dimension. Although the transistor gate features 202 may have any suitable dimension depending on the transistor device, the integrated circuit being designed and the micron technology being implemented, in this example, the CD is set to about 0.2 microns.

In an initial operation using the exemplary mask generation software tool (e.g., CATS), a dimension of about one-half of the CD is subtracted from each dimensional side of the transistor gate features 202 and the transistor gate contact features 204. Because the transistor gate features 202 are, in this example, 0.2 microns, when about 0.1 micron is subtracted from each dimensional side of the transistor gate features 202, the transistor gate features 202 will disappear.

Figure 2B:
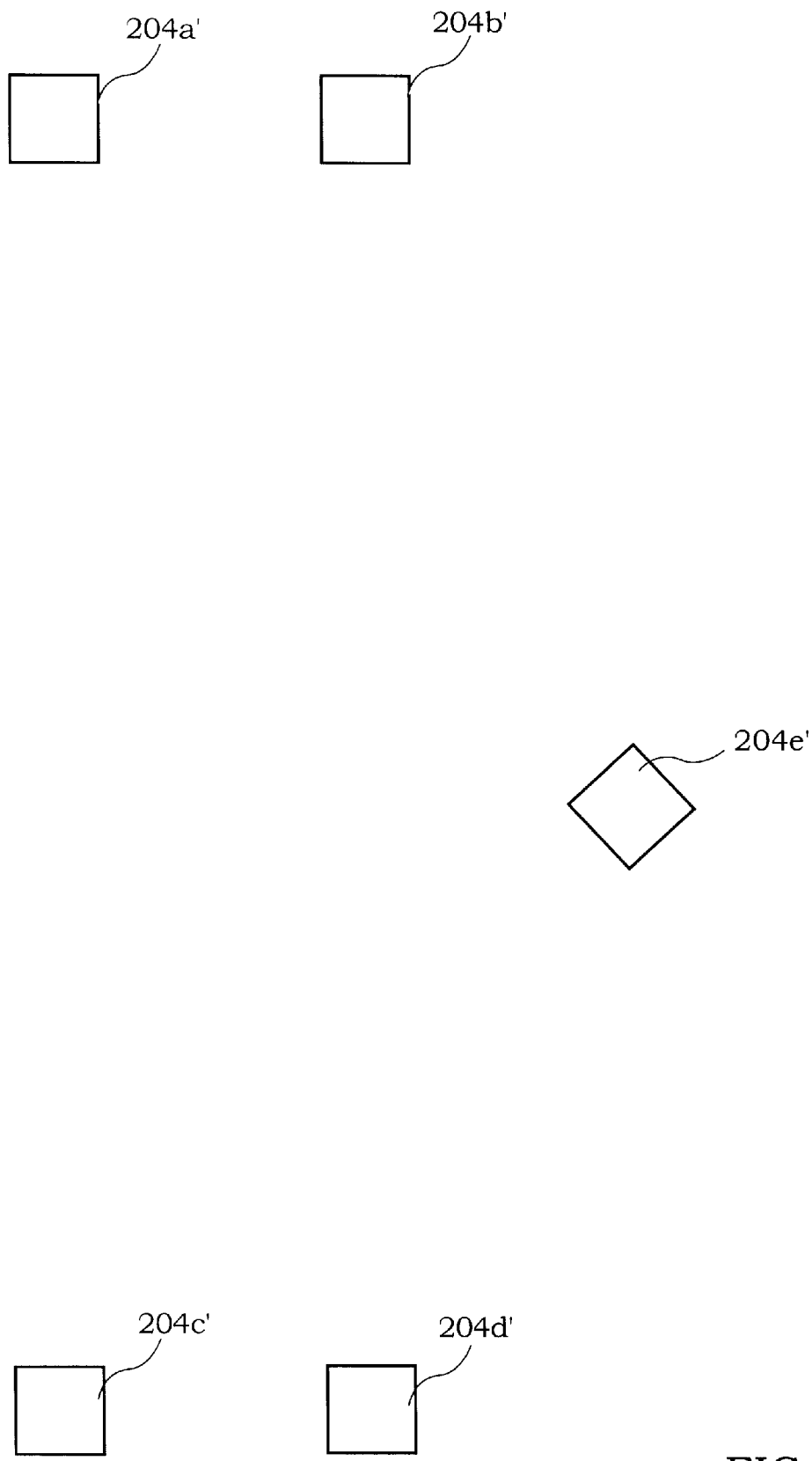
FIGS. 2B, 2C, and 3 pictorially illustrate operations that are performed using a mask generation software tool, in accordance with one embodiment of the present invention.
Figure 2C:
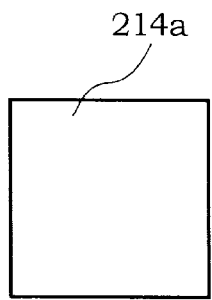
Figure 2C:
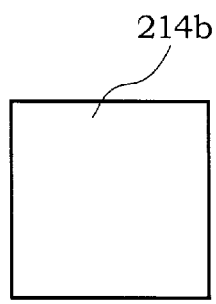
Figure 2C:
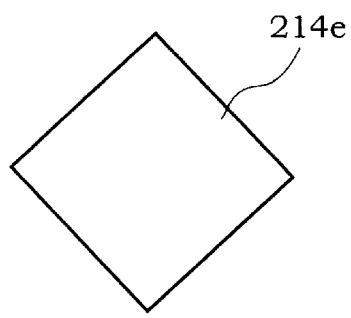
Figure 2C:
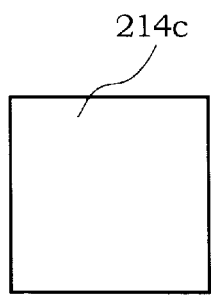
Figure 2C:
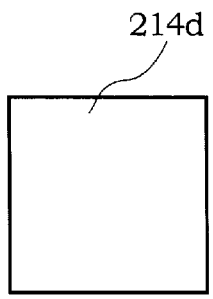

As shown in FIG. 2B, after the subtraction (i.e., size down) operation is performed from each dimensional side of the transistor gate mask 200 in FIG. 2A, reduced size transistor gate contacts 204' will result. Specifically, because the dimensions around the transistor gate contact features 204 are also reduced by about 0.1 microns at each dimension, the reduced size transistor contacts 204' will result. The mask generation software tool is then used to re-size (i.e., bloat) the reduced size transistor gate contacts 204' by increasing their dimension by about 0.1 microns per side to produce the transistor gate contacts 214a through 214e as shown in FIG. 2C.

Figure 3:
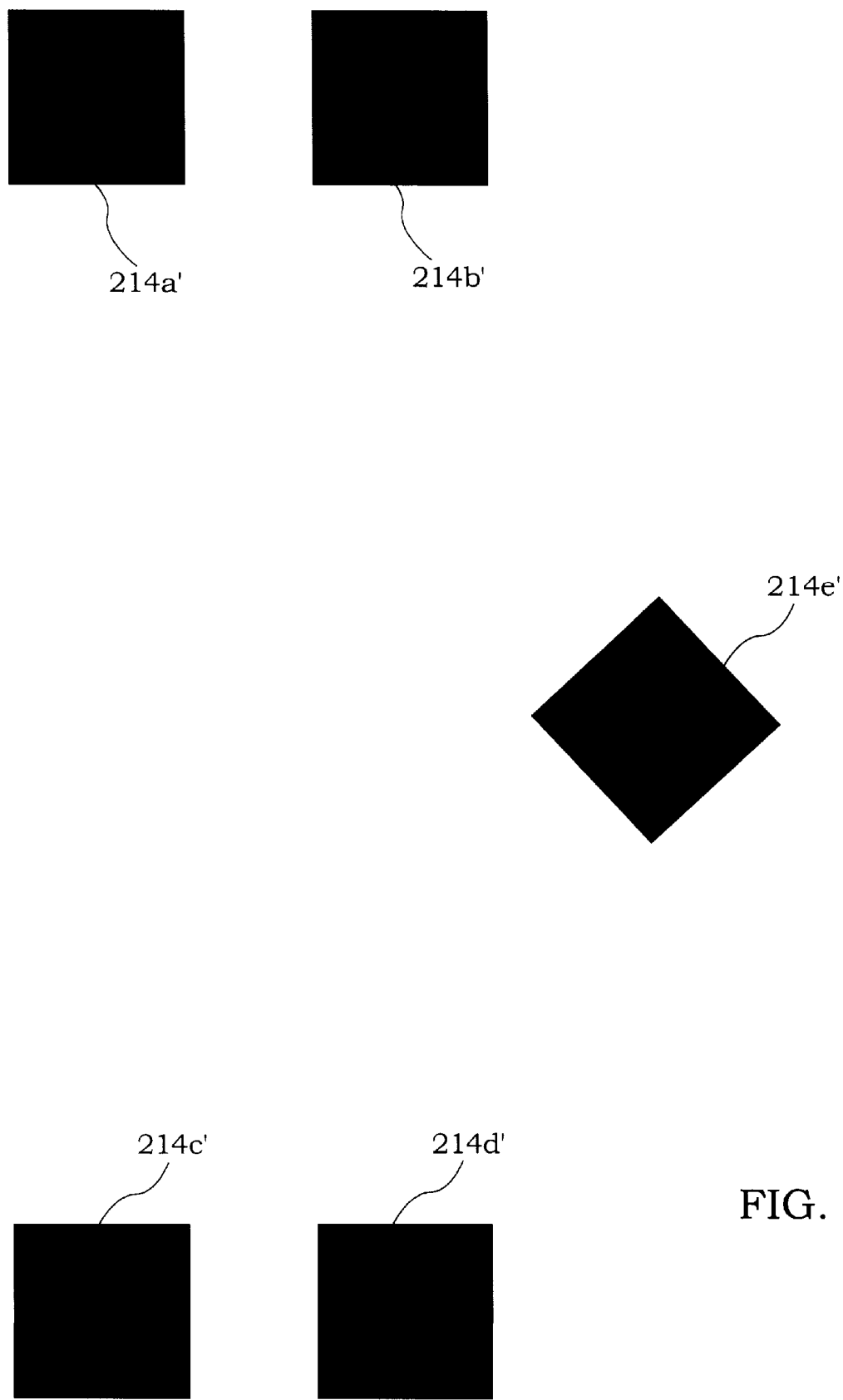

Once the transistor gate contacts 214 have been produced, the mask generation software will invert the transistor gate contacts 214 to produce inverted transistor gate contacts 214' as shown in FIG. 3. At this point, the mask generation software will perform a logical "AND" operation between the transistor gate mask 200 of FIG. 2A and the inverted transistor gate contacts 214' of FIG. 3. By performing the logical AND operation between these two digital file masks, the transistor gate contact features 204 of FIG. 2A are eliminated from the transistor gate mask design 200, leaving only the transistor gate features 202.

Figure 4A:
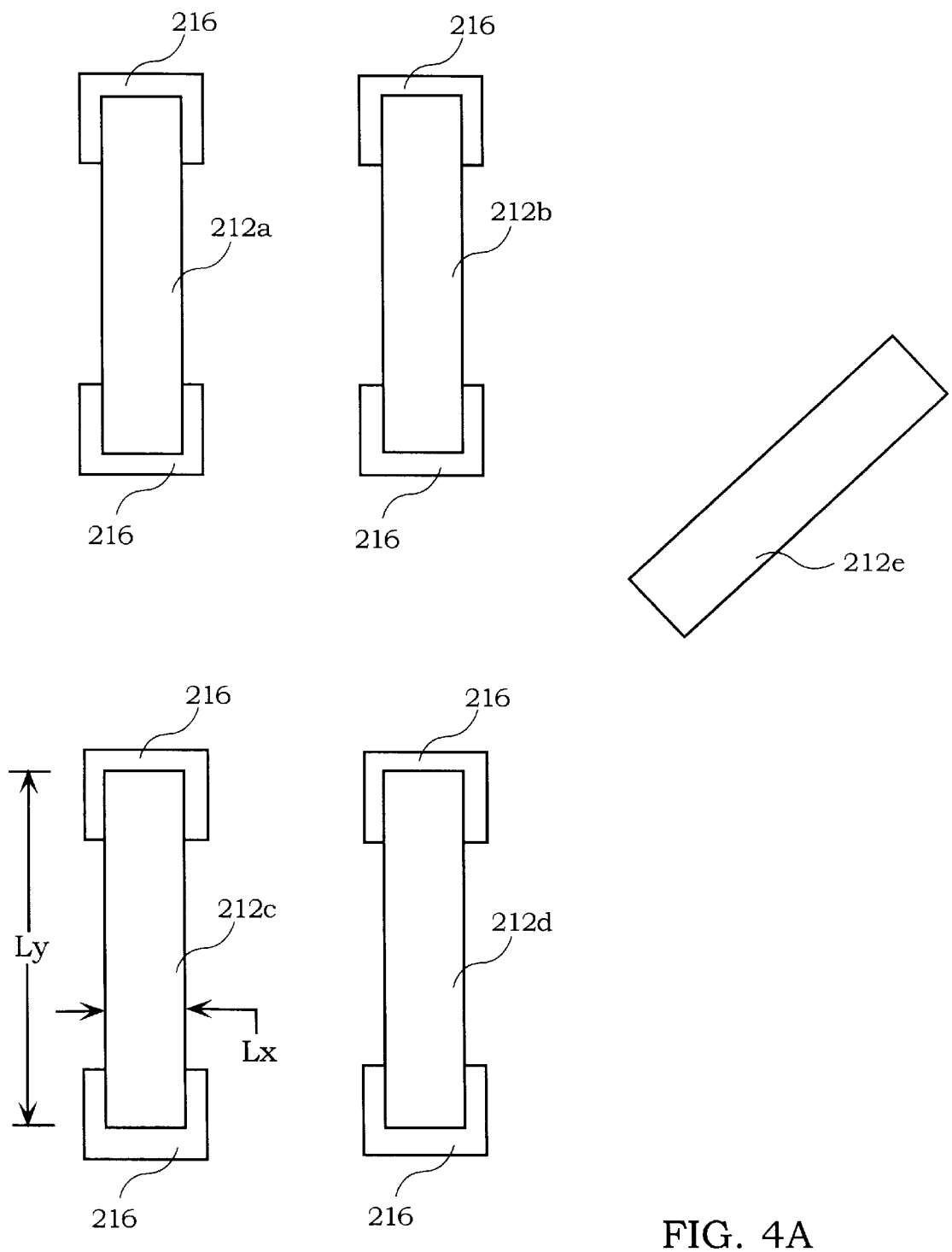

FIG. 4A shows the transistor gate features 202 represented by transistor gate features 212a through 212e after the transistor gate contact features 204 were removed from the transistor gate mask 200. At this point, the mask generation software tool will examine each of the transistor gate features 212a through 212e to determine whether there are any features having a dimension Lx that is greater than Ly (i.e., Lx>Ly). If any features having this requirement are found, hammerhead correction features 216 are added to each end or selected ends of the transistor gate features 212 in the X direction. In the example provided in FIG. 4A, no feature is greater in the Lx direction than the Ly direction, and therefore, no correction will be performed in the X direction at this point.

Next, the mask generation software can perform a logical determination of whether the Lx is less than the Ly dimension for any of the transistor gate features. In this example, transistor gate features 212a through 212d are each greater in the Ly dimension than the Lx dimension, and therefore, hammerhead correction features 216 will be added, in this example, at each end of the transistor gate features in the Y direction. At this point, if any features are rotated from either the horizontal or vertical axis, such as transistor gate feature 212e, a rotation, correction, and re-rotation operation is performed as illustrated in FIGS. 4B through 4E.

Figure 4F:
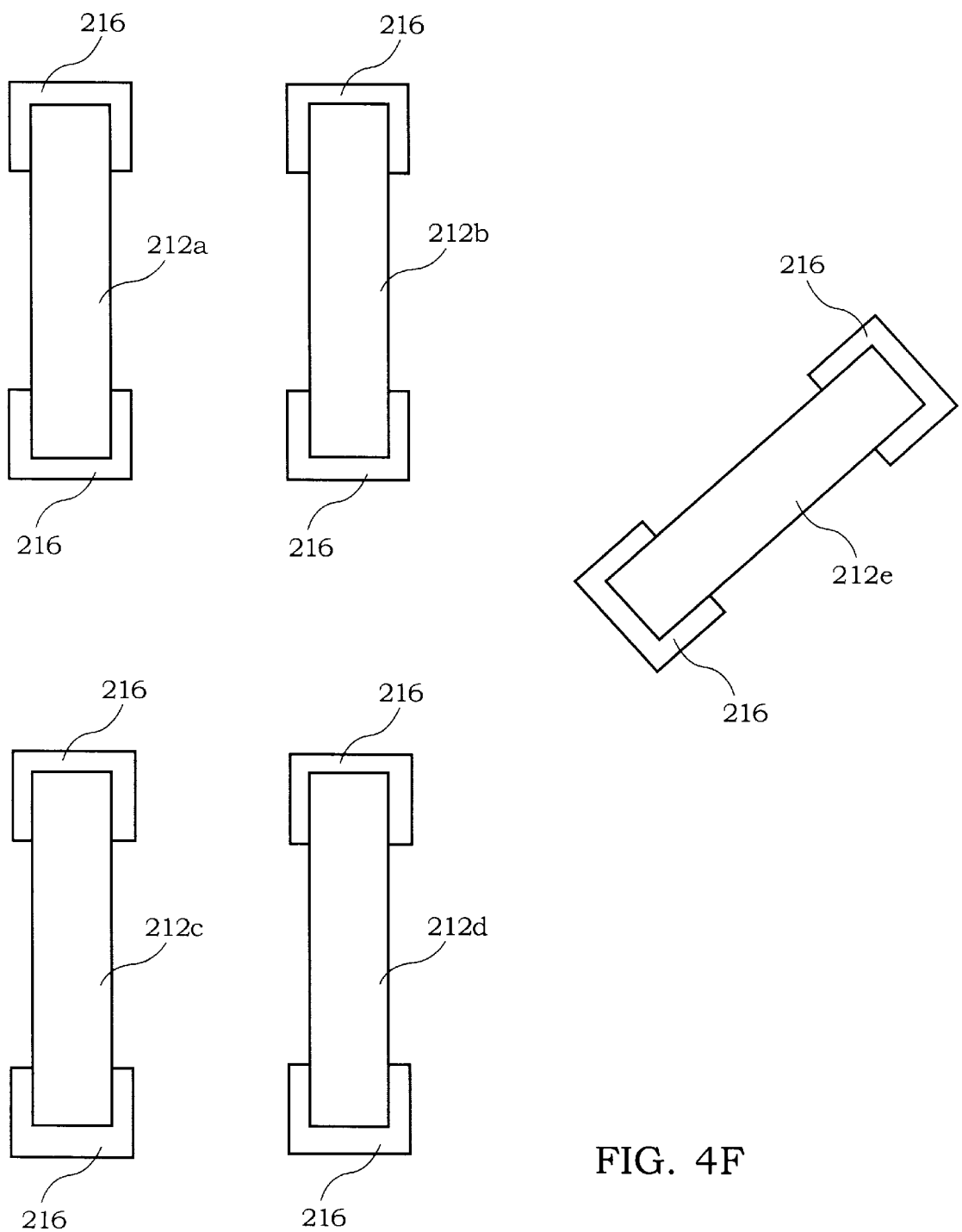

Initially, transistor gate feature 212e is shown at an angle φ from a horizontal axis. Initially, the mask generation software tool will rotate the transistor gate feature about a pivot point 220 until it is horizontal as shown in FIG. 4C. At this point, the mask generation software will determine whether the Lx dimension is greater than the Ly dimension. In this example, the Lx dimension is greater than the Ly dimension, and therefore hammerhead correction features 216 can be added to each end (or only a selected end) of the transistor gate feature 212e. Once the hammerhead correction features 216 have been added, the transistor gate feature 212e is once again rotated by the same angle φ about the pivot point 220 to its original angled position. Of course, other rotation techniques are also possible. Once corrected, it is integrated with the remaining features that were previously corrected in either the X or the Y dimension as shown in FIG. 4F.

Figure 4G:
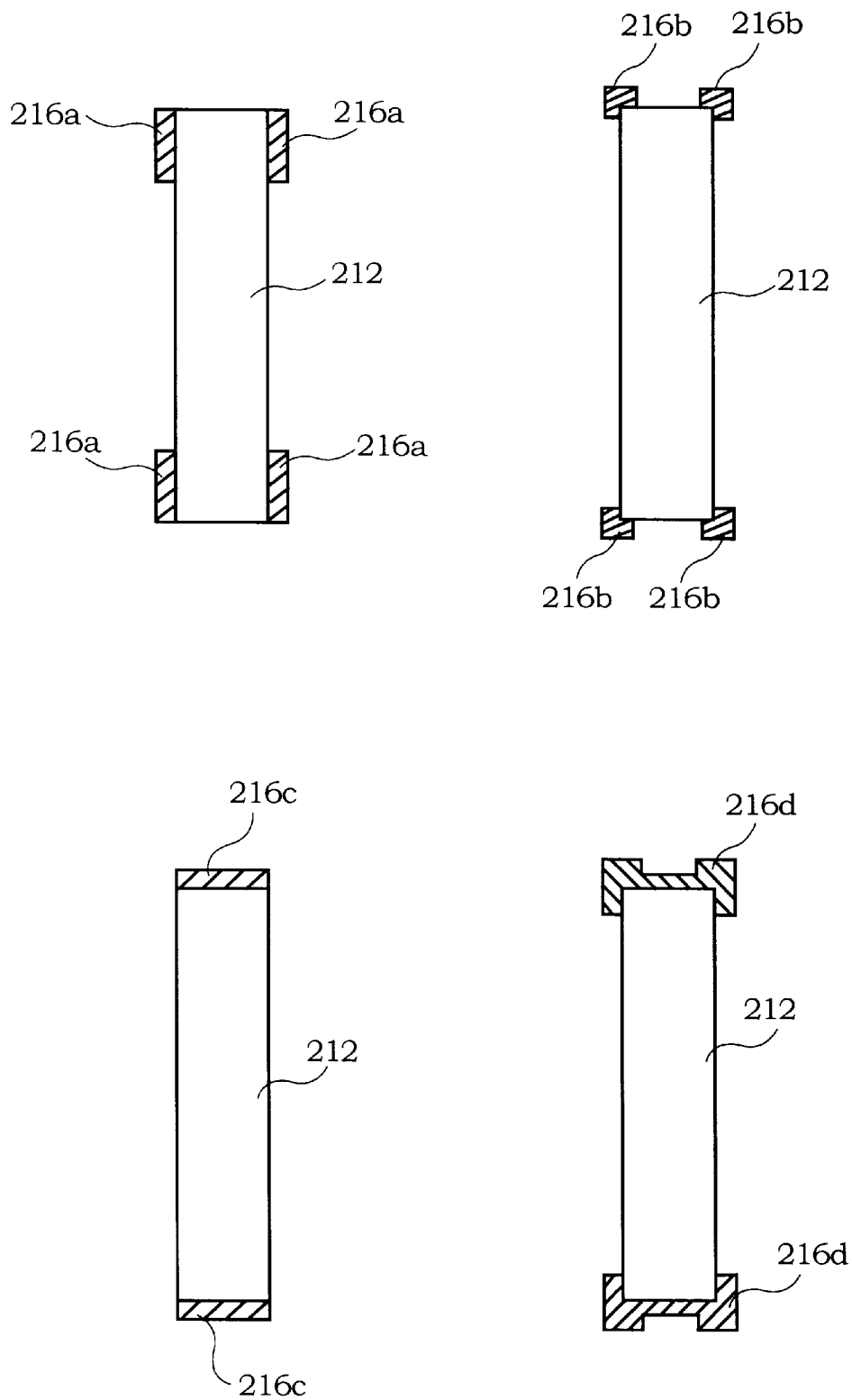

FIG. 4G shows alternative correction features that may be added to selected ends of the transistor gate features 212 in accordance with alternative embodiments of the present invention. As shown, features 216a may be added to the sides of the transistor gate features 212a near the ends, where anticipated optical proximity shrinking is known to occur. Another example of correction features may include correction features 216b, which are sometimes referred to as serifs and are added to the corners of the transistor gate features 212 (or any other geometric feature). Another way of combating the shrinkage of the transistor gate feature 212 is to add extensions 216c to selected ends of the features. In some cases, the correction features may be in the form of a modified hammerhead 216d.

In any event, the exact geometries of the correction features 216 may be modified depending upon the type of optical proximity shrinkage being experienced in a particular integrated circuit design. In addition, although only straight transistor gates are illustrated for ease of understanding, some transistor gates may have angled geometries, which may also be corrected using the techniques described herein. Accordingly, the hammerhead correction features and those shown in FIG. 4G are only exemplary geometries which may be modified accordingly.

Figure 5A:
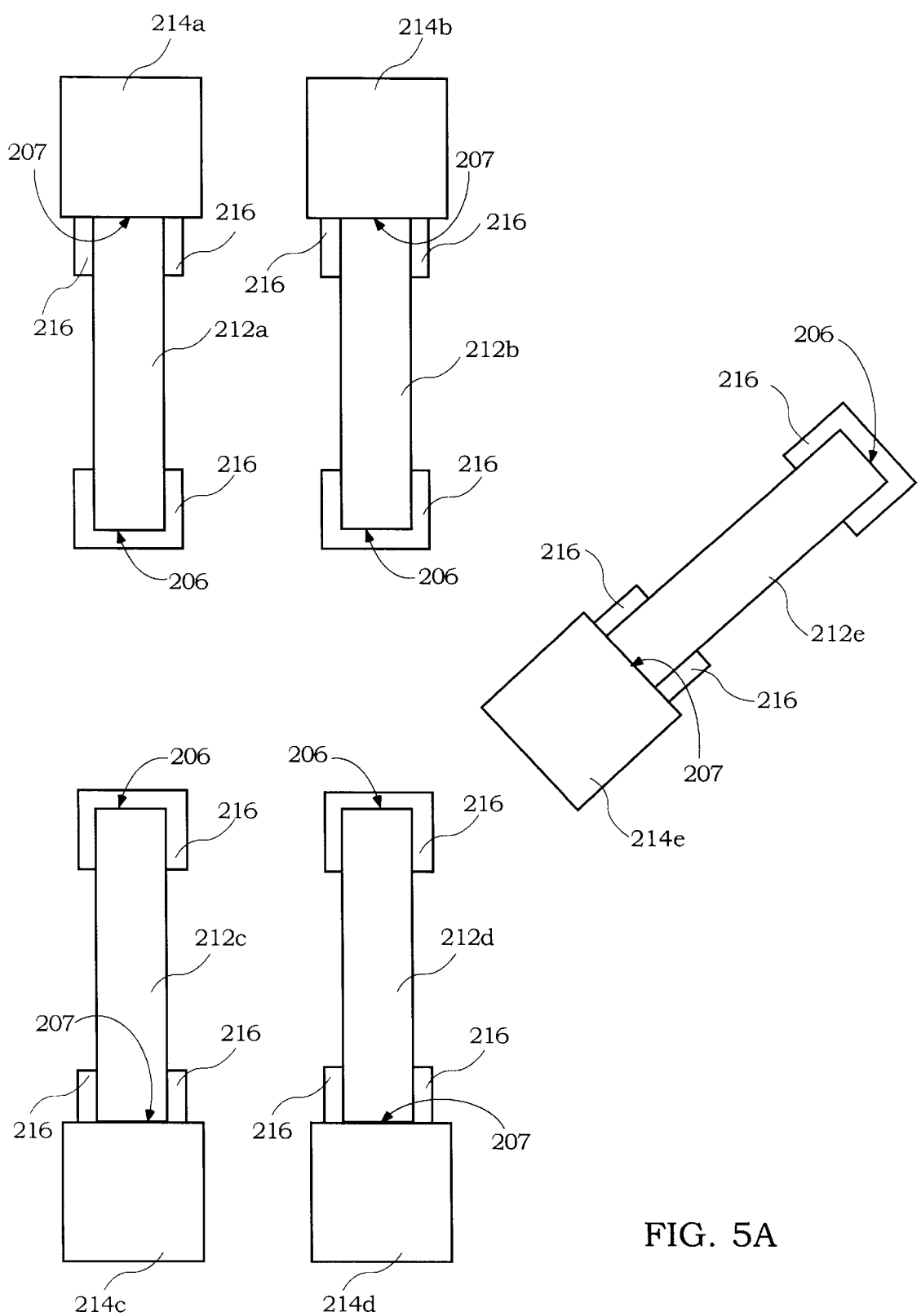
FIGS. 5A–5C illustrate features that have been corrected using the mask generation software tool, and the different types of correction features that may be used in accordance with one embodiment of the present invention.

FIG. 5A shows a mask layout for the transistor gates shown in FIG. 2A after the correction features 216, in the form of hammerhead geometries, have been added to the feature edges 206. In this example, the correction geometries 216 have been added to feature ends 207. When the correction features 216 were added to feature ends 207, they were added in the form of hammerhead correction geometries. However, to arrive at the geometric layout of FIG. 5A, the file mask of FIG. 2C that includes the transistor gate contact geometries 214 and the corrected transistor gate features 212 of FIG. 4F, were combined by performing a logical "OR" operation. That is, the logical OR operation will combine both the geometries of FIG. 4F and the geometries of FIG. 2C to arrive at the combined geometries of FIG. 5A.

Figure 1D:
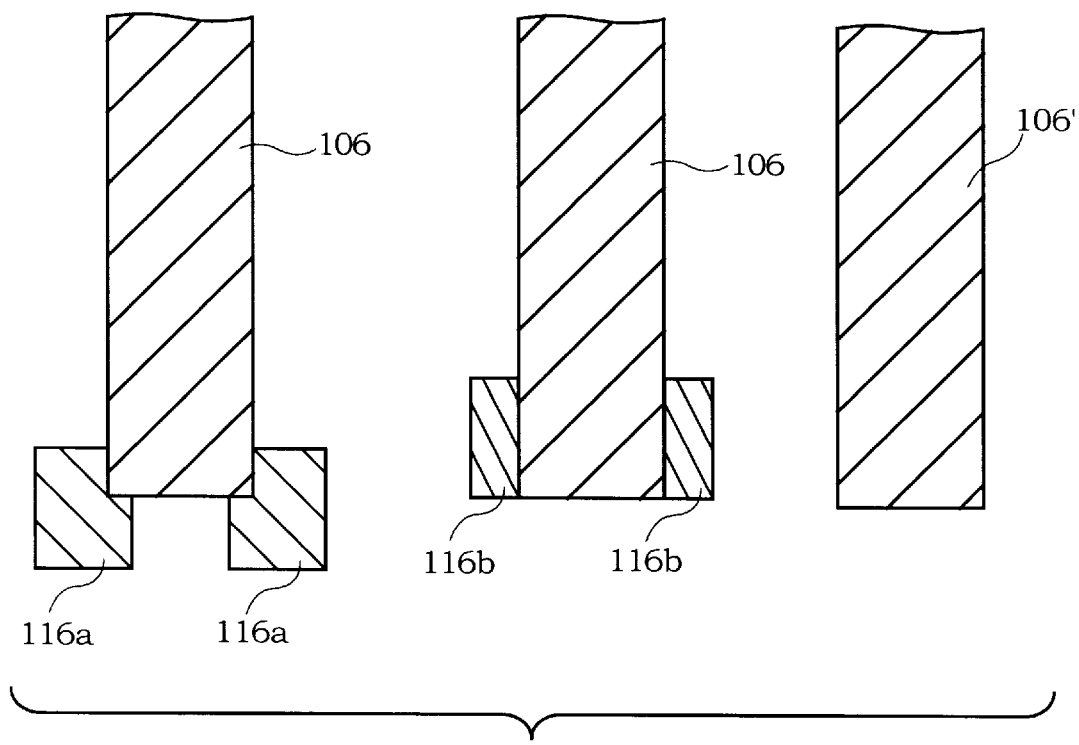
FIG. 1D illustrate several types of correction geometries that may be used to compensate for optical proximity distortion effects.
Figure 5B:
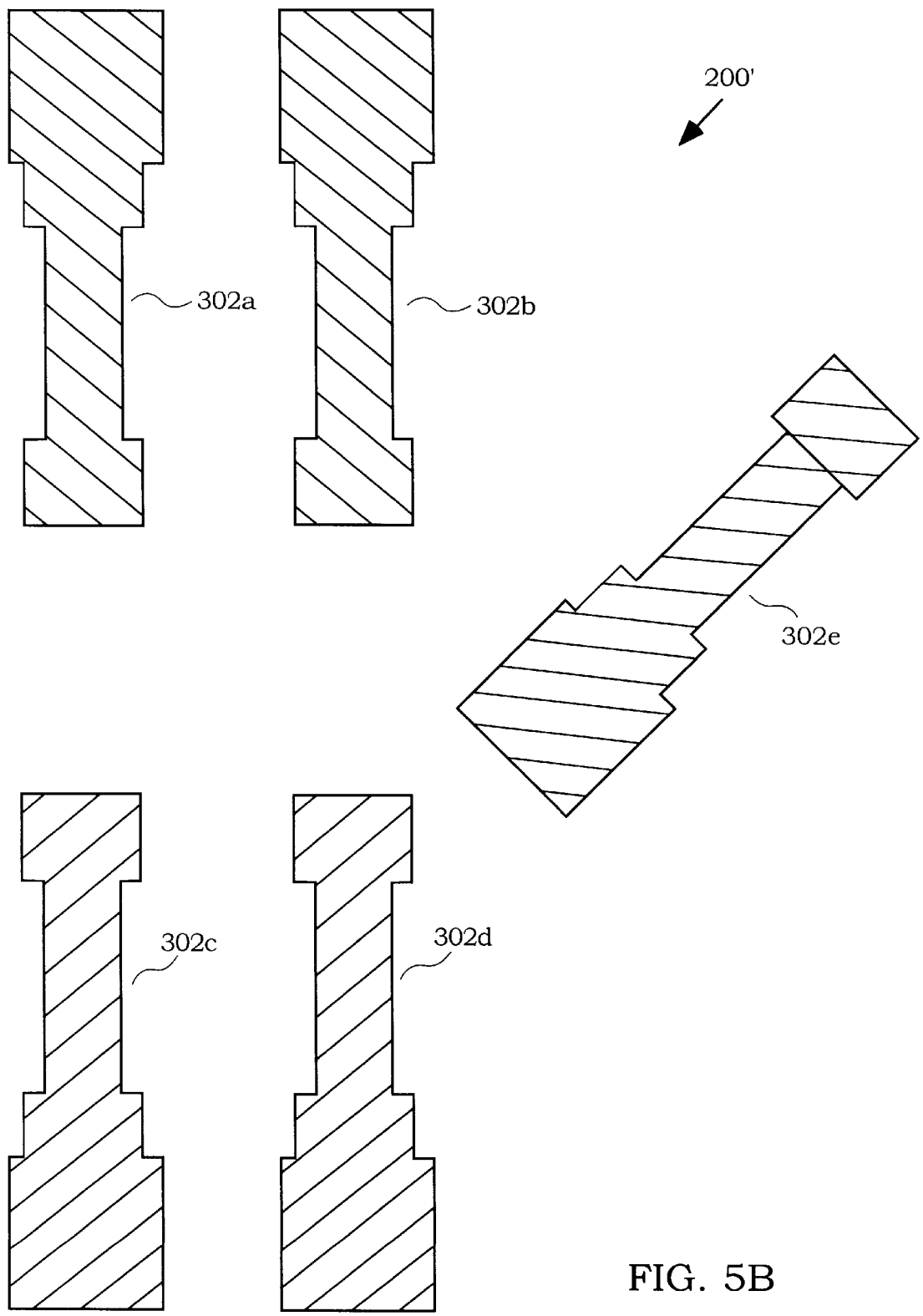

Although the geometries of FIG. 5A illustrate the individual components that make up the new modified polysilicon gate electrodes, they are actually integral shapes that are represented in the form of coordinates of a digital file, and are shown as single features in FIG. 5B. Therefore, FIG. 5B illustrates a corrected transistor gate mask having transistor gates 302a through 302e, each end having the correction hammerhead geometries that will assist in reducing the optical proximity shrinkage described with reference to the prior art in FIGS. 1A through 1C.

Figure 5C:
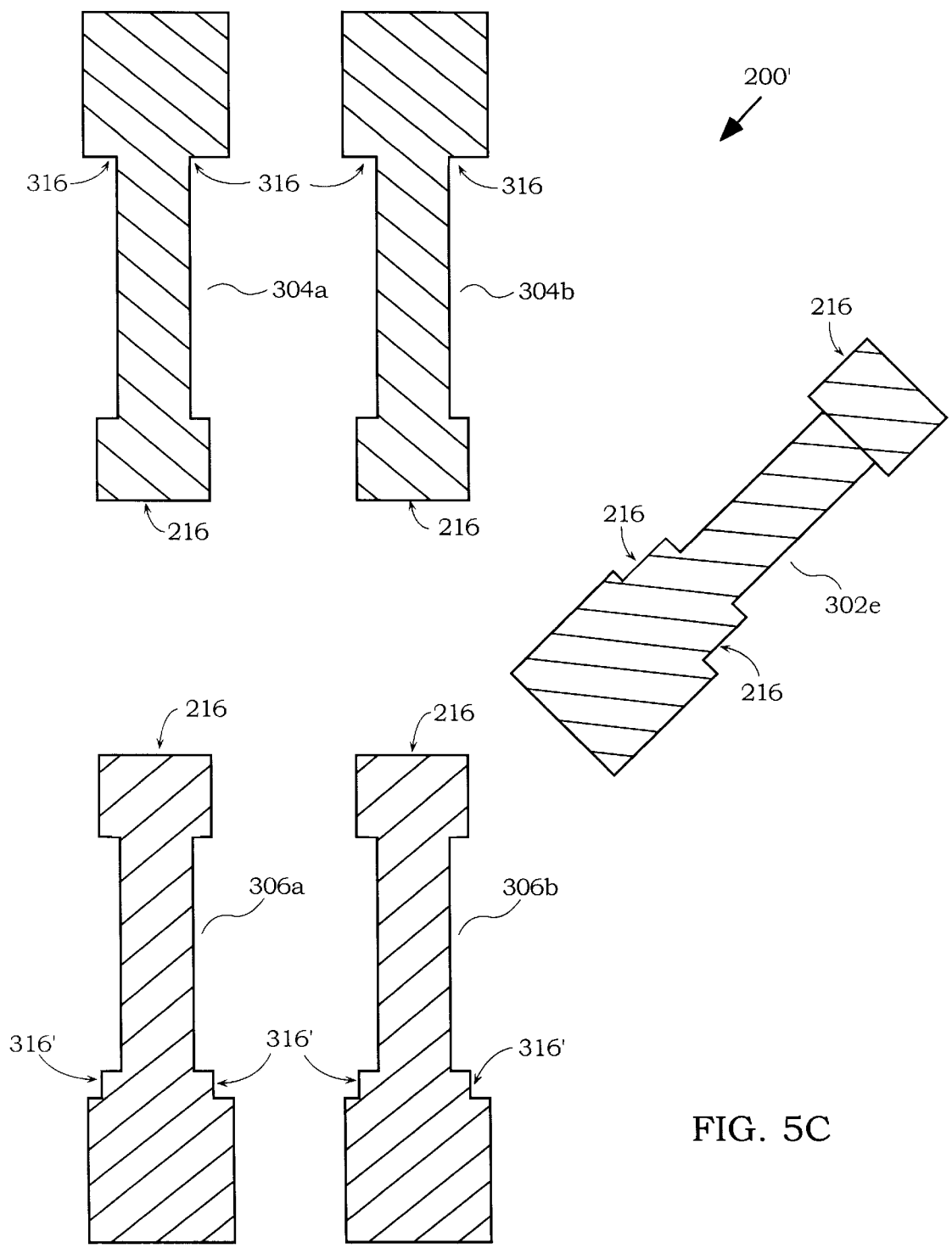

FIG. 5C illustrates the modularity of the present invention in that correction features may be placed at one end of the transistor gate features 304a and 304b, as compared to placing the hammerhead correction features 216 at both ends of the transistor gate features 212 as shown in FIG. 4F. Therefore, no correction feature is placed in locations 316, while still retaining hammerhead correction features 216 at the opposite ends where shrinkage is most common.

Also shown is a modified correction feature which is placed in locations 316', opposite the hammerhead correction features 216 in transistor gate features 306a and 306b. In some instances, it may be beneficial to implement shorter correction features at locations 316', when particular transistor widths are needed.

Figure 6:
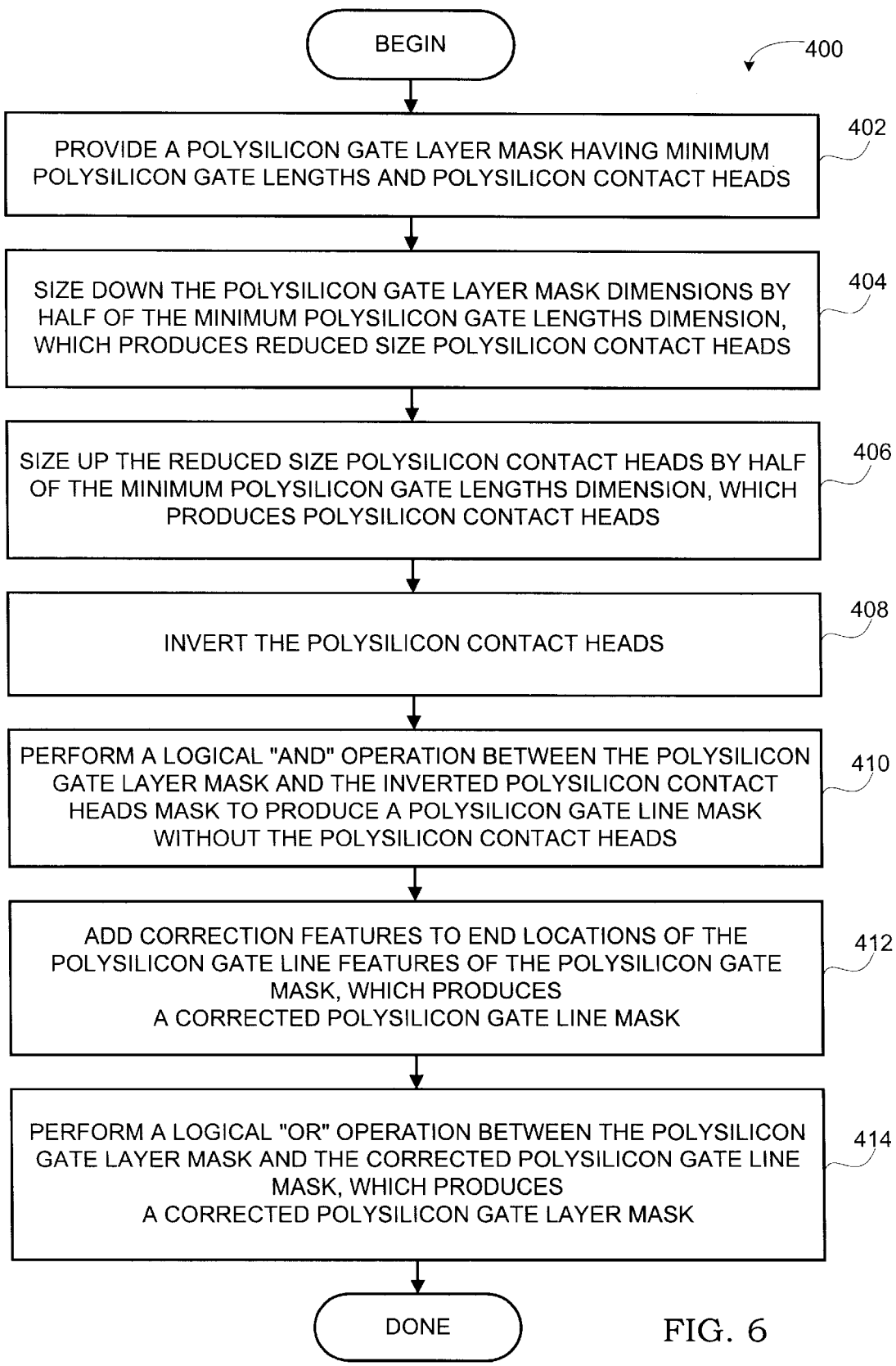
FIG. 6 shows a flowchart diagram illustrating the method operations performed in correcting polysilicon gate feature masks (or other types of critical features) in accordance with one embodiment of the present invention.

FIG. 6 shows a flowchart diagram 400 illustrating the method operations performed in correcting polysilicon gate feature masks in accordance with one embodiment of the present invention. The method begins at an operation 402 where a polysilicon gate layer mask having minimum polysilicon gate lengths and polysilicon contact heads is provided. As described above with respect to FIG. 2A, the minimum polysilicon gate lengths are defined by the critical dimensions (CD) which define the channel between the drain and source from a transistor device.

The method then proceeds to an operation 404 where the polysilicon gate layer mask dimensions are sized down by half of the minimum polysilicon gate length dimension. As described above, if the minimum polysilicon gate lengths are about 0.2 microns, when all the polysilicon gate layer mask dimensions are sized down by about half of the minimum polysilicon gate length dimensions, only reduced size polysilicon contact heads will remain as shown in FIG. 2B. The method now proceeds to an operation 406 where the reduced size polysilicon heads are sized up by about half of the minimum polysilicon gate length dimension (i.e., about 0.1 microns). The sizing up therefore produces polysilicon contact heads as shown in FIG. 2C.

Once the polysilicon contact heads are produced as shown in FIG. 2C, the polysilicon contact heads are inverted in operation 408 and shown in FIG. 3. Next, a logical "AND" operation is performed between the polysilicon gate layer mask and the inverted polysilicon contact heads mask to produce a polysilicon gate line mask without the polysilicon contact heads. The method now proceeds to an operation 412 where correction features are added to the end (or selected ends) locations of the polysilicon gate line features of the polysilicon gate mask. This produces a corrected polysilicon gate line mask as shown in FIG. 4F.

After the correction features have been added in operation 412, the method will proceed to an operation 414 where a logical "OR" operation is performed between the polysilicon gate layer mask (e.g., of FIG. 2A) and the corrected polysilicon gate line mask (e.g., of FIG. 4F) which produces a corrected polysilicon gate layer mask as shown in FIG. 5B.

Figure 7:
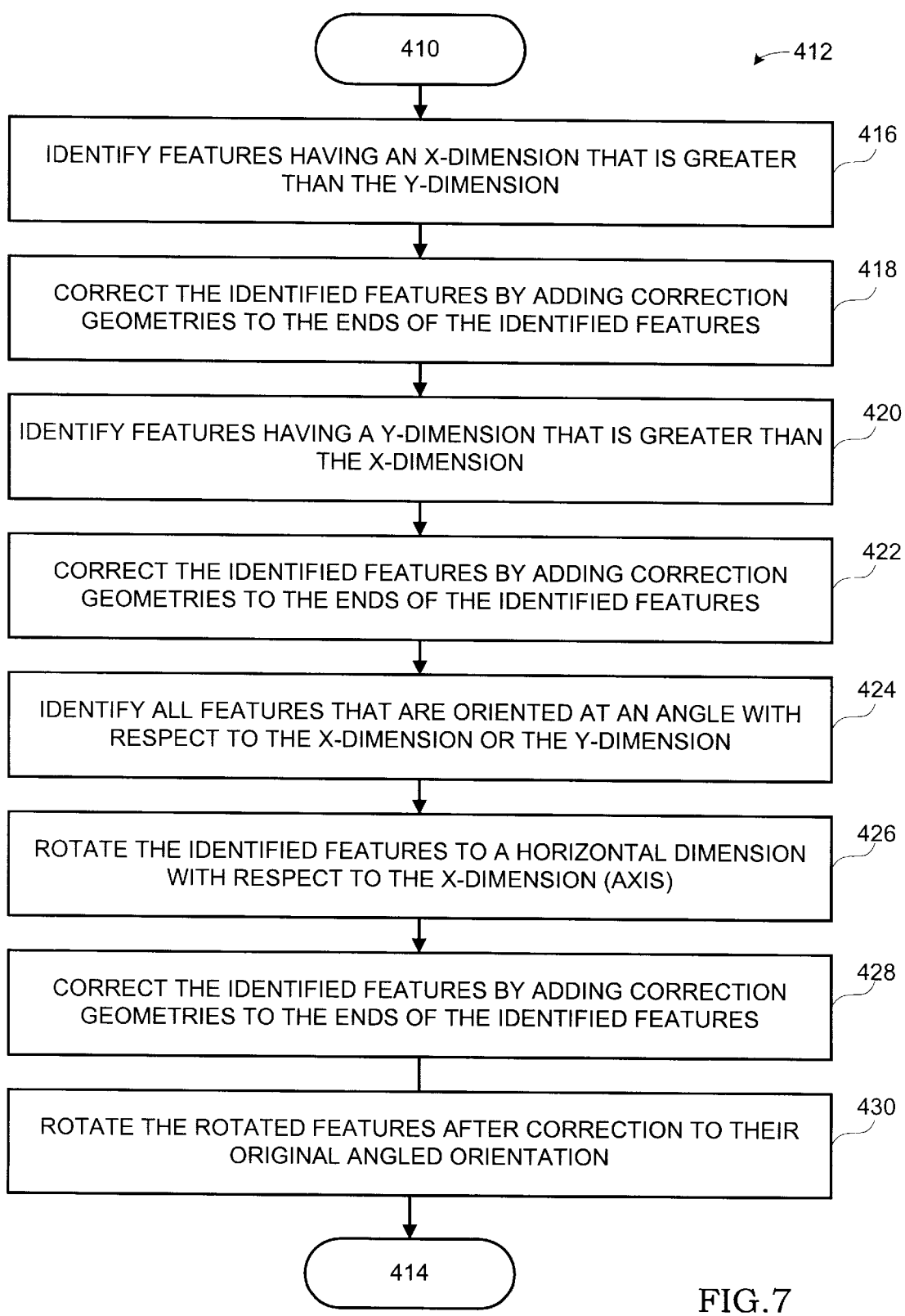
FIG. 7 shows a more detailed diagram of the method operation of adding correction features to selected end locations of the polysilicon gate line features during an operation of FIG. 6.

FIG. 7 shows a more detailed diagram of the method operation of adding correction features to selected end locations of the polysilicon gate line features of operation 412. The detailed method of operation 412 begins at an operation 416 where features having X dimensions that are greater than their Y dimensions are identified. Once those features have been identified in operation 416, the method will proceed to an operation 418 where the identified features are corrected by adding correction geometries to the ends of the identified features. Of course, it may also be desired that only one end of a desired feature be corrected as described with reference to FIG. 5C.

Next, the method proceeds to an operation 420 where features having Y dimensions that are greater than the X dimensions are identified. Once those features have been identified, the method will proceed to an operation 422 where the identified features are corrected by adding correction feature geometries to the ends (or selected ends) of the identified features. The method then proceeds to an operation 424 where all features that are oriented at an angle with respect to the X dimension or the Y dimension (i.e., X and Y axis), are identified. At this point, the method will proceed to an operation 426 where the identified features are rotated to a horizontal dimension that is defined by the X-axis.

Once all features that are positioned at an angle have been rotated to be horizontal features, the method will proceed to an operation 428 where the identified features are corrected by adding correction geometries to the ends (or selected ends), of the identified features. Once the correction has been performed in operation 428, the method will proceed to an operation 430 where the rotated features are once again rotated back to their original angles φ after being corrected. At that point, the method will proceed back to operation 414 of FIG. 6 as described above.

The invention may also employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below.

The invention can also be embodied as computer readable code on a computer readable medium. The computer readable medium is any data storage device that can store data which can be thereafter be read by a computer system.

Examples of the computer readable medium include read-only memory, random-access memory, CD-ROMs, magnetic tape, optical data storage devices. The computer readable medium can also be distributed over a network coupled computer systems so that the computer readable code is stored, accessed, shared, and/or executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for correcting features of an integrated circuit design that is embodied on a mask and is in the form of a digital file, comprising:

providing a transistor gate feature mask having transistor gates that have minimum gate lengths and contact heads;

sizing down the transistor gates by about half of the minimum gate lengths, such that only reduced size contact heads remain;

sizing up the reduced size contact heads to produce individual contact heads;

inverting the individual contact heads;

performing a logical AND operation between the transistor gate feature mask and the inverted individual contact heads to produce modified transistor gates without the contact heads;

adding correction features to selected ends of the modified transistor gates without contact heads to produce corrected transistor gates; and performing a logical OR operation between the corrected transistor gates and the transistor gate feature mask.

2. A method for correcting features of an integrated circuit design as recited in claim 1, wherein the adding correction features further includes:

identifying a first set of features of the modified transistor gates that have a horizontal dimension that is greater than a vertical direction;

integrating the correction features to the identified first set of features.

3. A method for correcting features of an integrated circuit design as recited in claim 2, wherein the adding correction features further includes:

identifying a second set of features of the modified transistor gates that have a vertical dimension that is greater than a horizontal dimension; and integrating the correction features to the identified second set of features.

4. A method for correcting features of an integrated circuit design as recited in claim 3, wherein the adding correction features further includes:

identifying a third set of features of the modified transistor gates that are offset by an angle from a horizontal axis;

rotating the third set of features such that the offset is eliminated and each of the features of the third set of features are aligned along the horizontal axis;

integrating the correction features to the identified third set of features; and rotating the third set of features back to the offset angle from the horizontal axis.

5. A method for correcting features of an integrated circuit design as recited in claim 1, wherein the adding correction features further comprises:

identifying end locations of the modified transistor gates without the contact heads; and selecting a correction feature geometry; and integrating the selected correction feature geometry to selected ones of the identified end locations to produce the corrected transistor gates.

6. A method for correcting features of an integrated circuit design as recited in claim 5, wherein the correction feature geometry is selected from a group consisting of hammerhead geometries, serif geometries, extension geometries, side widening geometries, and modified hammerhead geometries.

7. A method for correcting features of an integrated circuit design as recited in claim 1, wherein the transistor gates are configured to be within a core region of a semiconductor chip.

8. A method for correcting features of an integrated circuit design as recited in claim 1, wherein the sizing up the reduced size contact heads to produce individual contact heads is set to size up by the half of the minimum gate lengths.

9. A method for correcting features of an integrated circuit design as recited in claim 1, wherein the performing of the logical OR operation between the corrected transistor gates and the transistor gate feature mask produces a corrected transistor gate structure mask, the method further comprising:

implementing the corrected transistor gate structure mask to fabricate the integrated circuit design that is in the form of an integrated circuit chip.

10. A method for integrating correction features onto selected design features of an integrated circuit mask, comprising:

identifying a minimum dimension in the integrated circuit mask, the minimum dimension defining transistor gate electrode features;

removing feature geometries that are dimensionally larger than the minimum dimension;

integrating the correction features to selected ends of the transistor electrode features that have the minimum dimension to produce corrected transistor gate electrode features; and adding the corrected transistor gate electrode features to the removed feature geometries that are dimensionally larger than the minimum dimension to produce a corrected integrated circuit mask.

11. A method for integrating correction features onto selected design features of an integrated circuit mask as recited in claim 10, wherein the removing feature geometries further comprises:

subtracting from each side of each feature of the integrated circuit mask a dimension that is half of the minimum dimension which removes the transistor gate electrode features;

bloating any remaining features by the half of the minimum dimension to produce the feature geometries that are dimensionally larger than the minimum dimension;

inverting the feature geometries that are dimensionally larger than the minimum dimension; and performing a logical AND operation between the inverted feature geometries and the features of the integrated circuit mask which produces the transistor electrode features and excludes the feature geometries that are dimensionally larger than the minimum dimension.

12. A method for integrating correction features onto selected design features of an integrated circuit mask as recited in claim 10, wherein the feature geometries that are dimensionally larger than the minimum dimension are gate contact heads.

13. A method for integrating correction features onto selected design features of an integrated circuit mask as recited in claim 10, wherein the corrected integrated circuit mask is a polysilicon mask.

14. A method for integrating correction features onto selected design features of an integrated circuit mask as recited in claim 13, wherein the polysilicon mask is implemented in photolithography.

15. A method for integrating correction features onto selected design features of an integrated circuit mask as recited in claim 14, wherein the polysilicon mask is transferred to a photolithography reticle.

16. A method for integrating correction features onto selected design features of an integrated circuit mask as recited in claim 13, wherein the corrected integrated circuit mask defines transistor gate electrodes in an integrated circuit core.

17. A method for integrating correction features onto selected design features of an integrated circuit mask as recited in claim 13, wherein the correction features are selected from a group consisting of hammerhead geometries, serif geometries, extension geometries, side widening geometries, and modified hammerhead geometries.

18. A method for correcting core circuitry transistor geometries for anticipated optical proximity distortion, comprising:

selecting features in a polysilicon mask that have a minimum dimension, the minimum dimension defining transistor gate electrodes;

adding correction geometries to selected ends of the transistor gate electrodes to produce corrected transistor gate electrodes; and combining features in the polysilicon mask that do not have the minimum dimension and the corrected transistor gate electrodes to produce a corrected polysilicon mask.

19. A method for correcting core circuitry transistor geometries for anticipated optical proximity distortion as recited in claim 18, wherein the correction geometries compensates for anticipated shrinking of the transistor gate electrodes.

20. A method for correcting core circuitry transistor geometries for anticipated optical proximity distortion as recited in claim 18, wherein the selecting includes:

removing feature geometries from the polysilicon mask that are greater than the minimum dimension of the transistor gate electrodes.

\* \* \* \* \*